(12) United States Patent
Chen et al.

(10) Patent No.: US 8,531,809 B2
(45) Date of Patent: Sep. 10, 2013

(54) SURGE PROTECTOR

(75) Inventors: Kun-Jung Chen, Taichung (TW); Chi-Hsin Wang, Taichung (TW)

(73) Assignee: Tempotek Electronics Corp., Taichung (TW)

( * ) Notice: Subject to any disclaimer, the term of this patent is extended or adjusted under 35 U.S.C. 154(b) by 103 days.

(21) Appl. No.: 13/342,110

(22) Filed: Jan. 2, 2012

(65) Prior Publication Data

US 2012/0194956 A1 Aug. 2, 2012

(30) Foreign Application Priority Data

Jan. 31, 2011 (TW) .............................. 100202189 U
May 10, 2011 (TW) .............................. 100208353 U

(51) Int. Cl.
*H02H 3/20* (2006.01)
*H02H 3/10* (2006.01)
*H02H 9/04* (2006.01)
*H02H 9/06* (2006.01)

(52) U.S. Cl.
USPC ........................... 361/91.1; 361/120; 361/112

(58) Field of Classification Search
USPC ................................................ 361/112, 120
See application file for complete search history.

(56) References Cited

U.S. PATENT DOCUMENTS

| | | | | |
|---|---|---|---|---|
| 5,969,924 A | * | 10/1999 | Noble | 361/56 |
| 7,161,785 B2 | * | 1/2007 | Chawgo | 361/119 |
| 2002/0171992 A1 | * | 11/2002 | Palinkas et al. | 361/119 |

* cited by examiner

*Primary Examiner* — Rexford Barnie
*Assistant Examiner* — Liping Ai

(57) ABSTRACT

A surge protector includes a first surge suppression assembly comprising a first conductive layer comprising an arm, an extension distal to the arm and having toothed edges, and a substantially C-shaped member projecting out of the extension and having toothed edges, and a substantially circular member with toothed edges formed at an open end of the extension; a second conductive layer comprising an arm including a terminal, an extension being distal the arm, a first substantially C-shaped member having toothed edges, and a second substantially C-shaped member at an open end of the extension wherein the first substantially C-shaped member, the substantially C-shaped member, the second substantially C-shaped member, and the substantially circular member are arranged concentrically; and an overvoltage protection assembly interconnecting the arm and the terminal. The overvoltage protection assembly is electrically connected to the first surge suppression assembly.

12 Claims, 12 Drawing Sheets

SURGE PROTECTOR

BACKGROUND OF THE INVENTION

1. Field of the Invention

The invention relates to surge protectors and more particularly to such a surge protector with improved characteristics.

2. Description of Related Art

Surge protector is an appliance designed to protect electrical devices from voltage spikes. A surge protector attempts to limit the voltage supplied to an electric device by either blocking or by shorting to ground any unwanted voltages above a safe threshold.

There is a conventional surge protector comprising a first series circuit having a first inductance and a first alternating voltage limiter, including at least a first capacitance and a bi-directionally conductive rectifying circuit for charging the first capacitance, coupled between first and second input terminals for limiting surge currents and voltage excursions coupled to first and second load output terminals. The first alternating voltage limiter further comprises a sensing circuit for sensing at least one of the charging current supplied to and the voltage developed across the first capacitance. An auxiliary energy storage circuit and a normally open switching device responsive to the sensing circuit are provided for coupling the auxiliary energy storage circuit across the first capacitance during high energy surge conditions.

Notwithstanding prior literature, the invention is neither taught nor rendered obvious thereby.

SUMMARY OF THE INVENTION

One object of the invention is to provide a surge protector comprising a first surge suppression assembly comprising a base board, a first conductive layer disposed on the base board, a second conductive layer disposed on the base board and spaced from the first conductive layer wherein the first conductive layer comprises an arm, an extension distal to the arm and having toothed edges, a substantially C-shaped member projecting out of the extension and having toothed edges, and a substantially circular member with toothed edges formed at an open end of the extension to be disposed at about center of the substantially C-shaped member; the second conductive layer comprises an arm including a terminal, an extension being distal to the arm, a projecting first substantially C-shaped member having toothed edges, and a second substantially C-shaped member at an open end of the extension; and the first substantially C-shaped member, the substantially C-shaped member, the second substantially C-shaped member, and the substantially circular member are arranged in a concentric, spaced fashion with two sets of two half-circular gaps formed at positions spaced from both sides of the extension respectively; and an overvoltage protection assembly comprising an overvoltage protection member interconnecting the arm and the terminal; wherein the overvoltage protection assembly is electrically connected to the first surge suppression assembly via the arm; and wherein the overvoltage protection member is implemented as a unitary member, a plurality of members connected in series, or a plurality of members connected in parallel.

The above and other objects, features and advantages of the invention will become apparent from the following detailed description taken with the accompanying drawings.

DETAILED DESCRIPTION OF THE INVENTION

Figure 1:
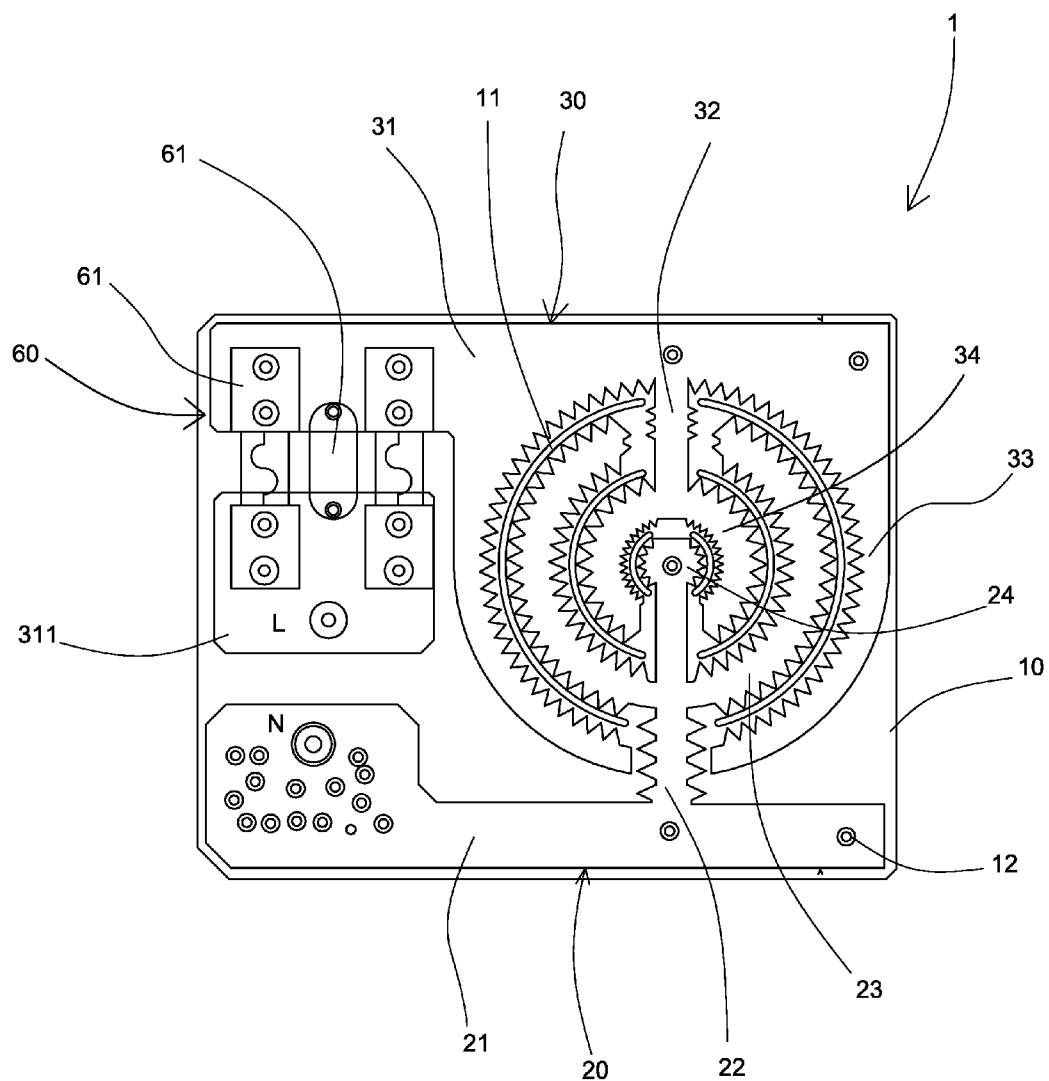
FIG. 1 is a plan view of a surge protector according to the invention, a rear panel of the surge protector being removed so as to show an overvoltage protection assembly and a first preferred embodiment of first surge suppression assembly of the surge protector.

Referring to FIGS. 1 to 4, a surge protector incorporating an overvoltage protection assembly 60 and a first preferred embodiment of first surge suppression assembly 1 in accordance with the invention is shown and discussed in detail below.

The first surge suppression assembly 1 comprises a base board 10, a sheet shaped first conductive layer 20, and a sheet shaped second conductive layer 30. The first conductive layer 20 is provided on the base board 10 and spaced from the first conductive layer 30. The first conductive layer 20 comprises an arm 21, an extension 22 projecting out of the arm 21 and being at a right angle thereto, and a first substantially C-shaped member 23 projecting out of the extension 22. Each of the extension 22 and the first substantially C-shaped member 23 has toothed edges.

The second conductive layer 30 is provided on the base board 10 and comprises an arm 31 including a terminal 311, an extension 32 being spaced from the arm 31 and at a right angle thereto, and a second substantially C-shaped member 33 with the extension 32 surrounded therein. Each of the extension 32 and the second substantially C-shaped member 33 has toothed edges.

A substantially circular member 24 with toothed edge is formed at an open end of the extension 22 to be disposed at about center of the first substantially C-shaped member 23. A third substantially C-shaped member 34 is provided at an open end of the extension 32 distal to a joining portion of the extension 32 and the second substantially C-shaped member 33. From outside to inside, the second substantially C-shaped member 33, the first substantially C-shaped member 23, the third substantially C-shaped member 34, and the substantially circular member 24 are arranged in a concentric, spaced fashion with two sets of two half-circular gaps 11 formed at positions spaced from both sides of the extension 22 respectively.

The overvoltage protection assembly 60 is electrically connected to the first surge suppression assembly 1 via the arm 31. The overvoltage protection assembly 60 comprises an overvoltage protection member 61 interconnecting the arm 31 and the terminal 311. The overvoltage protection member 61 is a fuse, a circuit breaker, or a MOV (metal oxide varistor). The overvoltage protection member 61 may be implemented as a unitary member in a first configuration (see FIG. 2), a plurality of members connected in series in a second configuration (see FIG. 3), or a plurality of members connected in parallel in a third configuration (see FIG. 4).

Referring to FIGS. 5 to 9, there is shown a surge protector incorporating the overvoltage protection assembly 60, the first preferred embodiment of first surge suppression assembly 1, and a second surge suppression assembly 70 which is connected in parallel to the first surge suppression assembly 1. The same as the overvoltage protection assembly described in FIGS. 1 to 3, the overvoltage protection member 61 can be implemented as a unitary member in a first configuration (see FIG. 5), a plurality of members connected in series in a second configuration (see FIG. 6), or a plurality of members connected in parallel in a third configuration (see FIG. 7).

The second surge suppression assembly 70 is substantially the same as the first surge suppression assembly 1 except the following: The second surge suppression assembly 70 comprises a rectangular support 71, two spaced wires 72 each having a discharge end 73 passing through the support 71, a portion of the discharge end 73 separated from the wire 72 by the support 71 being surrounded by an insulating medium 711, the discharge ends 73 being separated by a gap, and a cover 74 having a plurality of openings 741 for ventilation purpose, the cover 74 adapted to complimentarily engage with the support 71 to conceal the discharge ends 73 and the insulating mediums 711. Two terminals 73 of the second surge suppression assembly 70 distal to the discharge ends 73 are electrically connected to the first and second conductive layers 20, 30 respectively.

The provision of the second surge suppression assembly 70 can limit voltage supplied to an electrical device (i.e., a load electrically connected between the terminal 311 and the arm 21) by blocking any unwanted voltages above a safe threshold.

Figure 10:
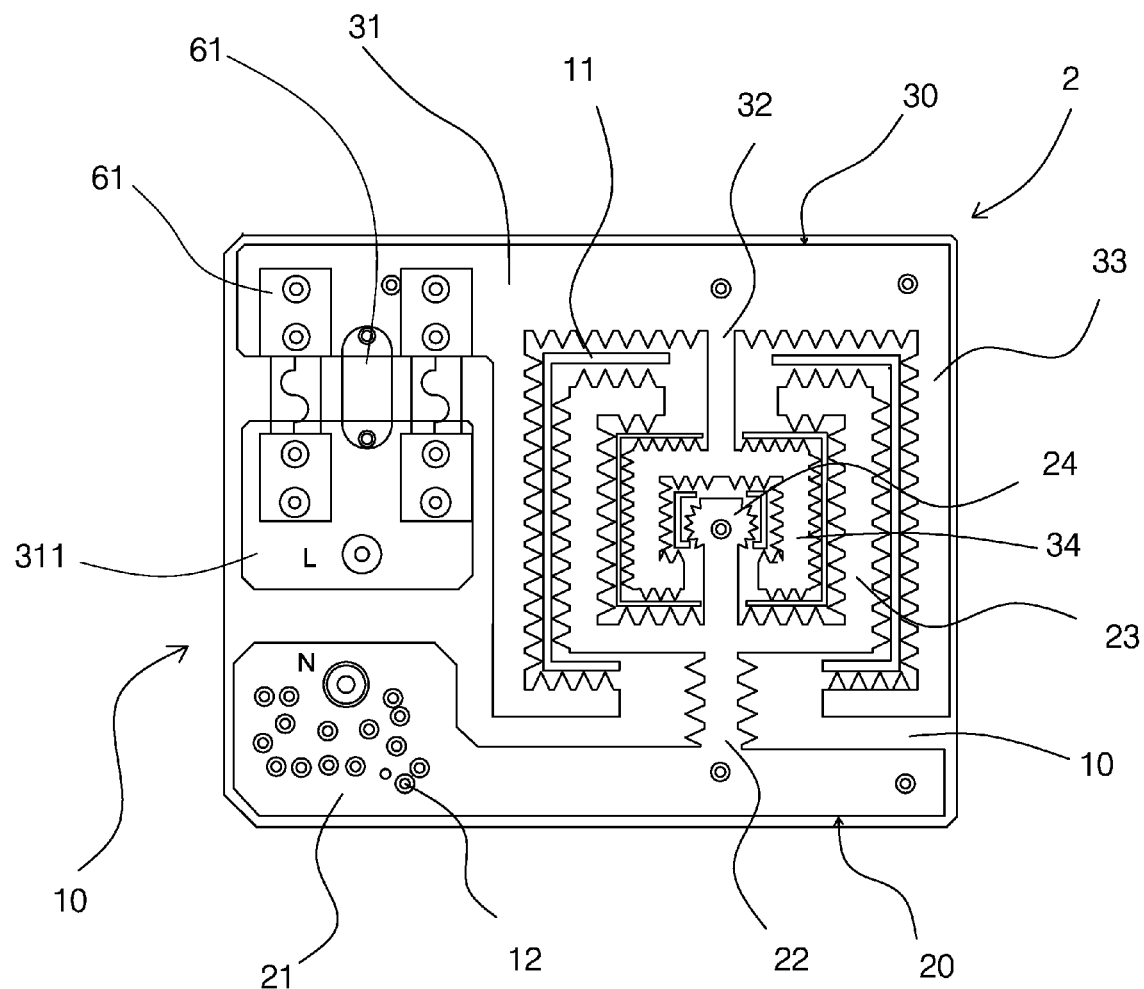
FIG. 10 is a plan view of a surge protector according to the invention, a rear panel of the surge protector being removed so as to show the overvoltage protection assembly and a second preferred embodiment of first surge suppression assembly of the surge protector.

Referring to FIG. 10, a surge protector incorporating the overvoltage protection assembly 60 and a second preferred embodiment of first surge suppression assembly 2 is shown. Characteristics of the second preferred embodiment of the first surge suppression assembly 2 are described in detailed below. The second preferred embodiment of the first surge suppression assembly 2 comprises a base board 10, a sheet shaped first conductive layer 20, and a sheet shaped second conductive layer 30. The first conductive layer 20 is provided on the base board 10 and comprises an arm 21, an extension 22 projecting out of the arm 21 and being at a right angle thereto, and a square bracket shaped member 23, as subject matter of the second preferred embodiment of the first surge suppression assembly 2, projecting out of the extension 22. Each of the extension 22 and the square bracket shaped member 23 has toothed edges.

The second conductive layer 30 is provided on the base board 10 and comprises an arm 31 including a terminal 311, an extension 32 distal to the arm 31 and being at a right angle thereto, and a projecting first square bracket shaped 33 with the extension 32 surrounded therein. Each of the extension 32 and the first square bracket shaped 33 has toothed edges.

A substantially circular member 24 with toothed edge is formed at an open end of the extension 22 to be disposed at about center of the square bracket shaped member 23. A second square bracket shaped member 34 is provided at an open end of the extension 32 distal to a joining portion of the extension 32 and the first square bracket shaped 33. From outside to inside, the first square bracket shaped 33, the square bracket shaped member 23, the second square bracket shaped member 34, and the substantially circular member 24 are arranged in a spaced fashion with two sets of large and small square bracket shaped gaps 11 formed at positions spaced from both sides of the extension 22 respectively.

Figure 11:
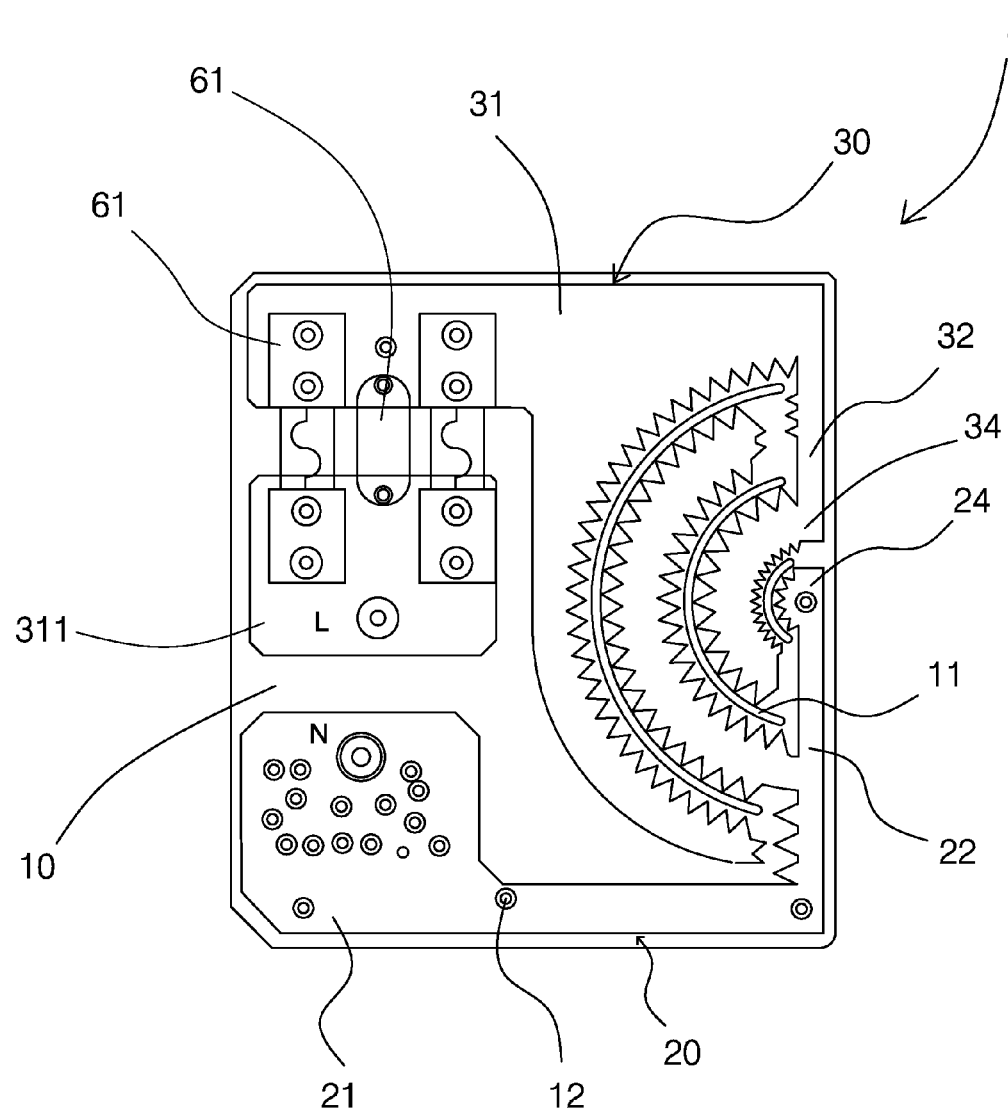
FIG. 11 is a plan view of a surge protector according to the invention, a rear panel of the surge protector being removed so as to show the overvoltage protection assembly and a third preferred embodiment of first surge suppression assembly of the surge protector.

Referring to FIG. 11, a surge protector incorporating the overvoltage protection assembly 60 and a third preferred embodiment of first surge suppression assembly 3 is shown. Characteristics of the third preferred embodiment of the first surge suppression assembly 3 are described in detailed below. The third preferred embodiment of the first surge suppression assembly 3 comprises a base board 10, a sheet shaped first conductive layer 20, and a sheet shaped second conductive layer 30. The first conductive layer 20 is provided on the base board 10 and comprises an arm 21, an extension 22 distal to the arm 21 and being at a right angle thereto, and a substantially half-circular member 23, as the subject matter of the third preferred embodiment of the first surge suppression assembly 3, projecting out of the extension 22. Each of the extension 22 and the substantially half-circular member 23 has toothed edges.

The second conductive layer 30 is provided on the base board 10 and comprises an arm 31 including a terminal 311, an extension 32 distal to the arm 31 and being at a right angle thereto, and a first substantially half-circular member 33 projecting out of the arm 31 with the extension 32 surrounded therein. Each of the extension 32 and the first substantially half-circular member 33 has toothed edges.

A substantially half-circular member 24 with toothed edge is formed at an open end of the extension 22 to be disposed at about center both ends of the substantially half-circular member 23. A second substantially half-circular member 34 is provided at an open end of the extension 32 distal to a joining portion of the extension 32 and the first substantially half-circular member 33. From outside to inside, the first substantially half-circular member 33, the substantially half-circular member 23, the second substantially half-circular member 34, and the substantially half-circular member 24 are arranged in a spaced fashion with two substantially half-circular gaps 11 formed between the first substantially half-circular member 33 and the substantially half-circular member 23, and between the second substantially half-circular member 34 and the substantially half-circular member 23 respectively.

Referring to FIGS. 12 to 15, a surge protector incorporating the overvoltage assembly and a fourth preferred embodiment of first surge suppression assembly 4 is shown. Characteristics of the fourth preferred embodiment of the first surge suppression assembly 4 are described in detailed below. The fourth preferred embodiment of the first surge suppression assembly 4 comprises a base board 10, a sheet shaped first conductive layer 20, and a sheet shaped second conductive layer 30. The first conductive layer 20 is provided on the base board 10 and comprises an arm 21, an extension 22 distal to the arm 21 and being at a right angle thereto, and a substantially half-circular member 23, as the subject matter of the fourth preferred embodiment of the first surge suppression assembly 4, projecting out of the extension 22. Each of the extension 22 and the substantially half-circular member 23 has toothed edges.

The second conductive layer 30 is provided on the base board 10 and comprises an arm 31 including a terminal 311, an extension 32 distal to the arm 31 and being at a right angle thereto, and a first substantially half-circular member 33 projecting out of the arm 31 with the extension 32 surrounded therein. Each of the extension 32 and the first substantially half-circular member 33 has toothed edges.

A substantially half-circular member 24 with toothed edge is formed at an open end of the extension 22 to be disposed at about center both ends of the substantially half-circular member 23. A second substantially half-circular member 34 is provided at an open end of the extension 32 distal to a joining portion of the extension 32 and the first substantially half-circular member 33. From outside to inside, the first substantially half-circular member 33, the substantially half-circular member 23, the second substantially half-circular member 34, and the substantially half-circular member 24 are arranged in a spaced fashion with two substantially half-circular gaps 11 formed between the first substantially half-circular member 33 and the substantially half-circular member 23, and between the second substantially half-circular member 34 and the substantially half-circular member 23 respectively.

Figure 13:
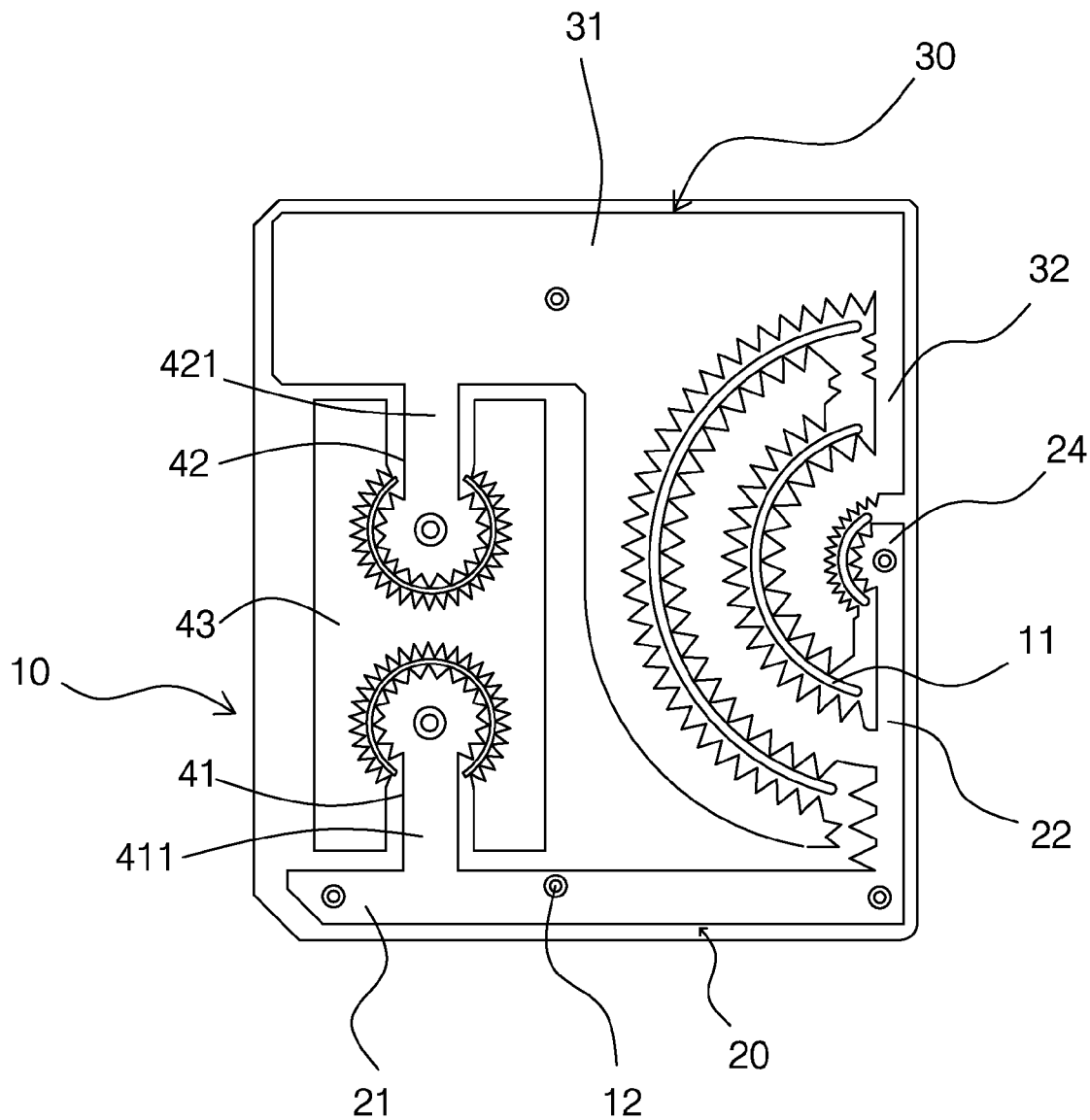
FIG. 13 is a plan view of another configuration of the surge protector shown in FIG. 12.

It is noted that the first surge suppression assembly shown in FIG. 13 is its another configuration. Thus, a detailed discussion of the configuration shown in FIG. 13 is omitted herein for the sake of brevity.

Figure 12:
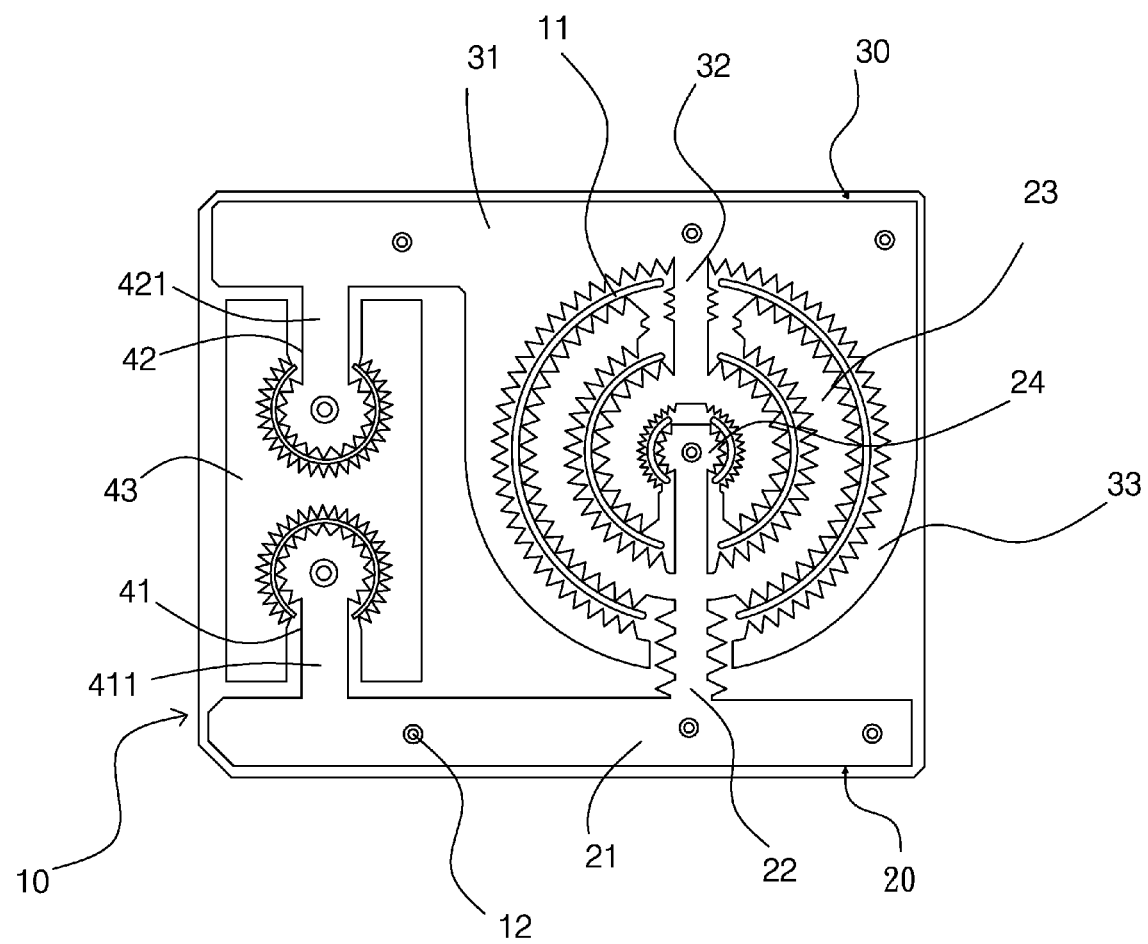
FIG. 12 is a plan view of a surge protector according to the invention, a rear panel of the surge protector being removed so as to show the overvoltage protection assembly and a fourth preferred embodiment of first surge suppression assembly of the surge protector.
Figure 14:
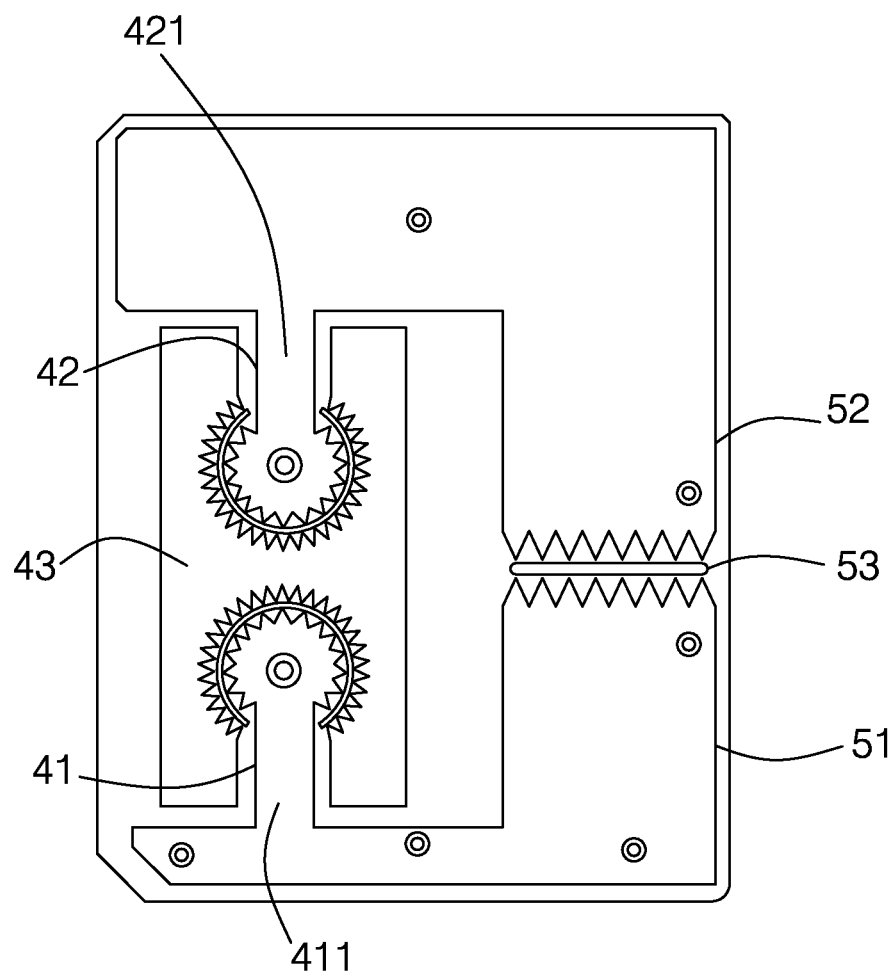
FIG. 14 is a plan view of yet another configuration of the surge protector shown in FIG. 12.

As shown in FIG. 14, it is yet another configuration of the first surge suppression assembly shown in FIG. 12. The characteristics are that the first surge suppression assembly can be electrically connected to each of the first to fourth surge protectors. The fourth surge protector includes a fifth conductive layer 51 and a sixth conductive layer 52. One ends of the fifth conductive layer 51 and the sixth conductive layer 52 are electrically connected to a third conductive layer 41 and a fourth conductive layer 42 respectively and the other ends thereof are provided with opposite teeth. A gap 53 is formed between the fifth conductive layer 51 and the sixth conductive layer 52. The effect of discharging voltage spikes also can be achieved.

Figure 2:
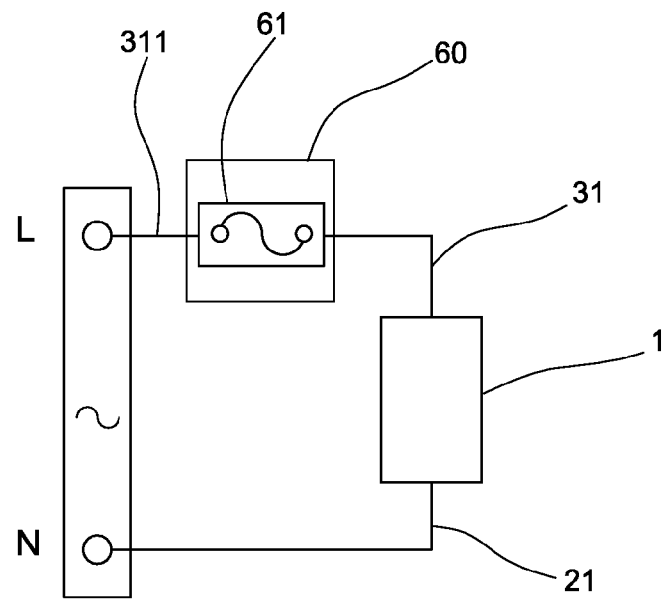
FIG. 2 schematically depicts electrical connection of the first surge suppression assembly and a first configuration of the overvoltage protection assembly.
Figure 3:
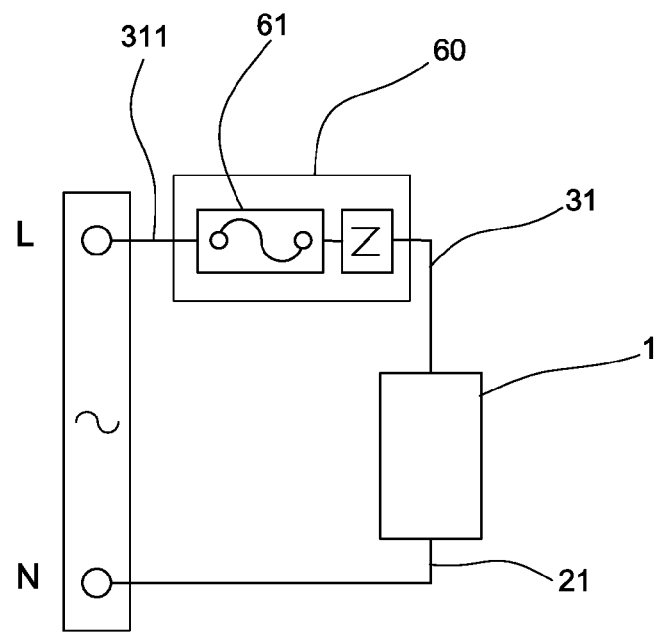
FIG. 3 schematically depicts electrical connection of the first surge suppression assembly and a second configuration of the overvoltage protection assembly.
Figure 4:
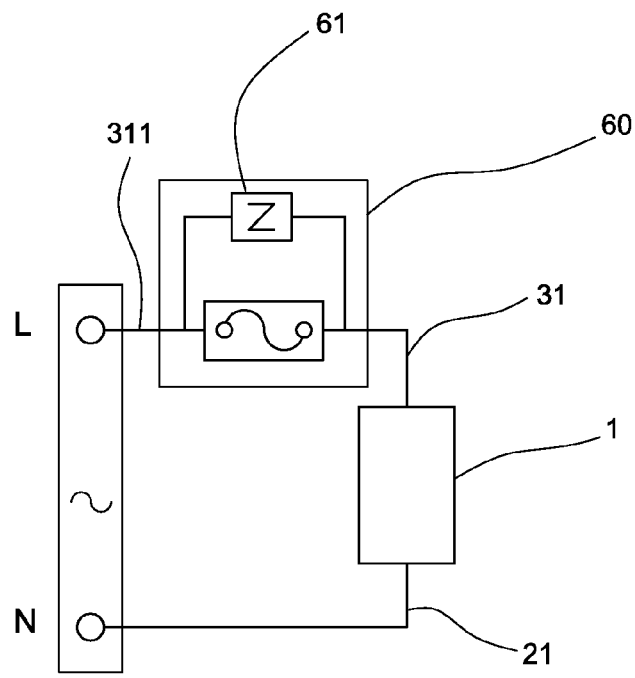
FIG. 4 schematically depicts electrical connection of the first surge suppression assembly and a third configuration of the overvoltage protection assembly.
Figure 5:
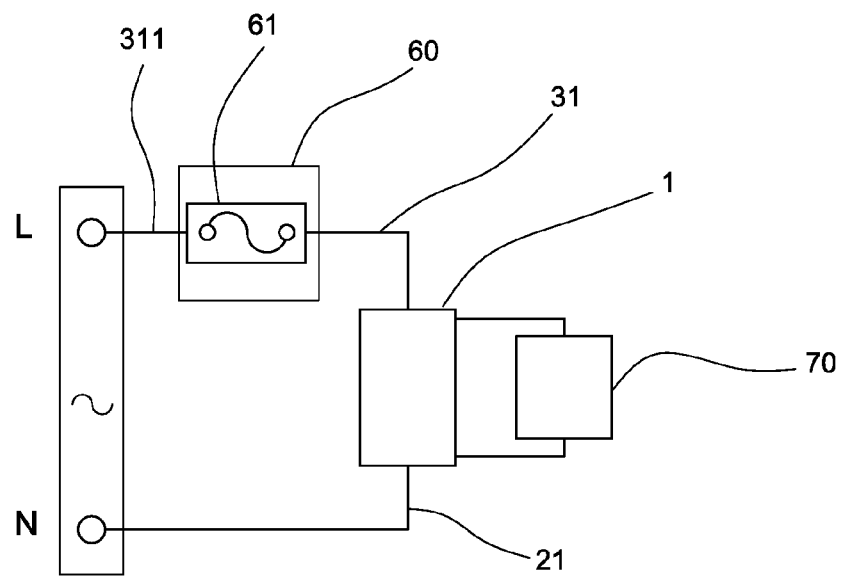
FIG. 5 schematically depicts electrical connection of the first surge suppression assembly, the first configuration of the overvoltage protection assembly, and a second surge suppression assembly.
Figure 6:
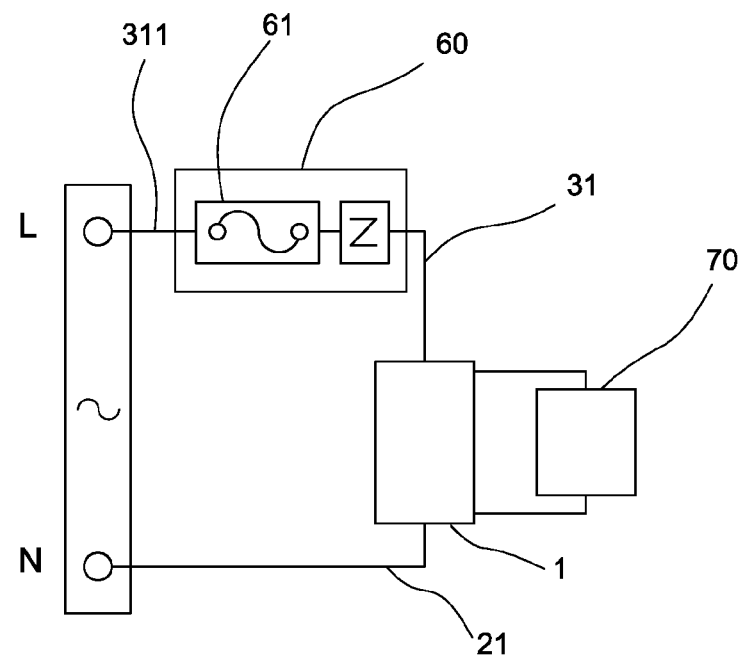
FIG. 6 schematically depicts electrical connection of the first surge suppression assembly, the second configuration of the overvoltage protection assembly, and the second surge suppression assembly.
Figure 7:
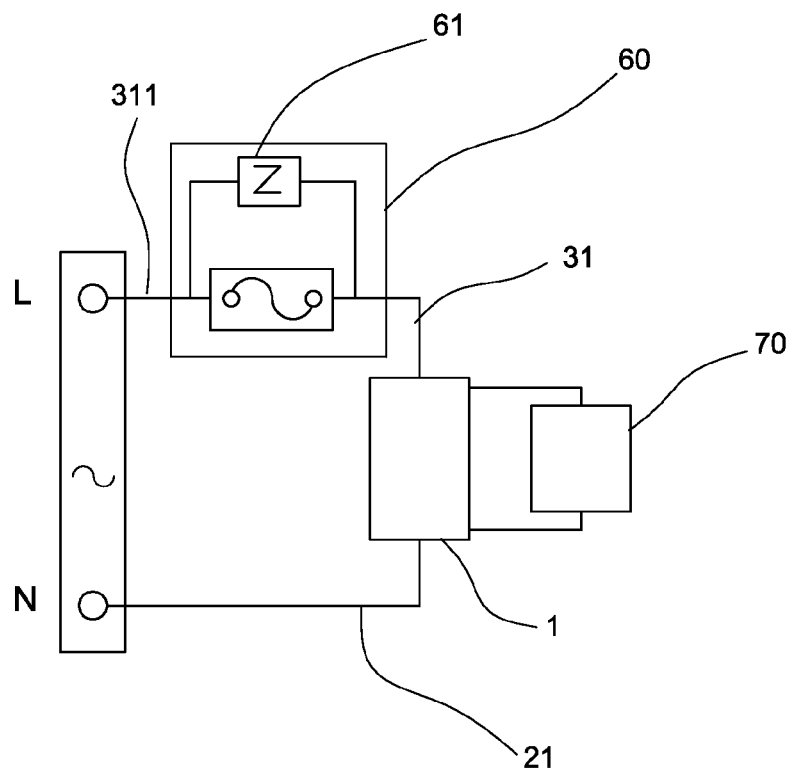
FIG. 7 schematically depicts electrical connection of the first surge suppression assembly, the third configuration of the overvoltage protection assembly, and the second surge suppression assembly.
Figure 8:
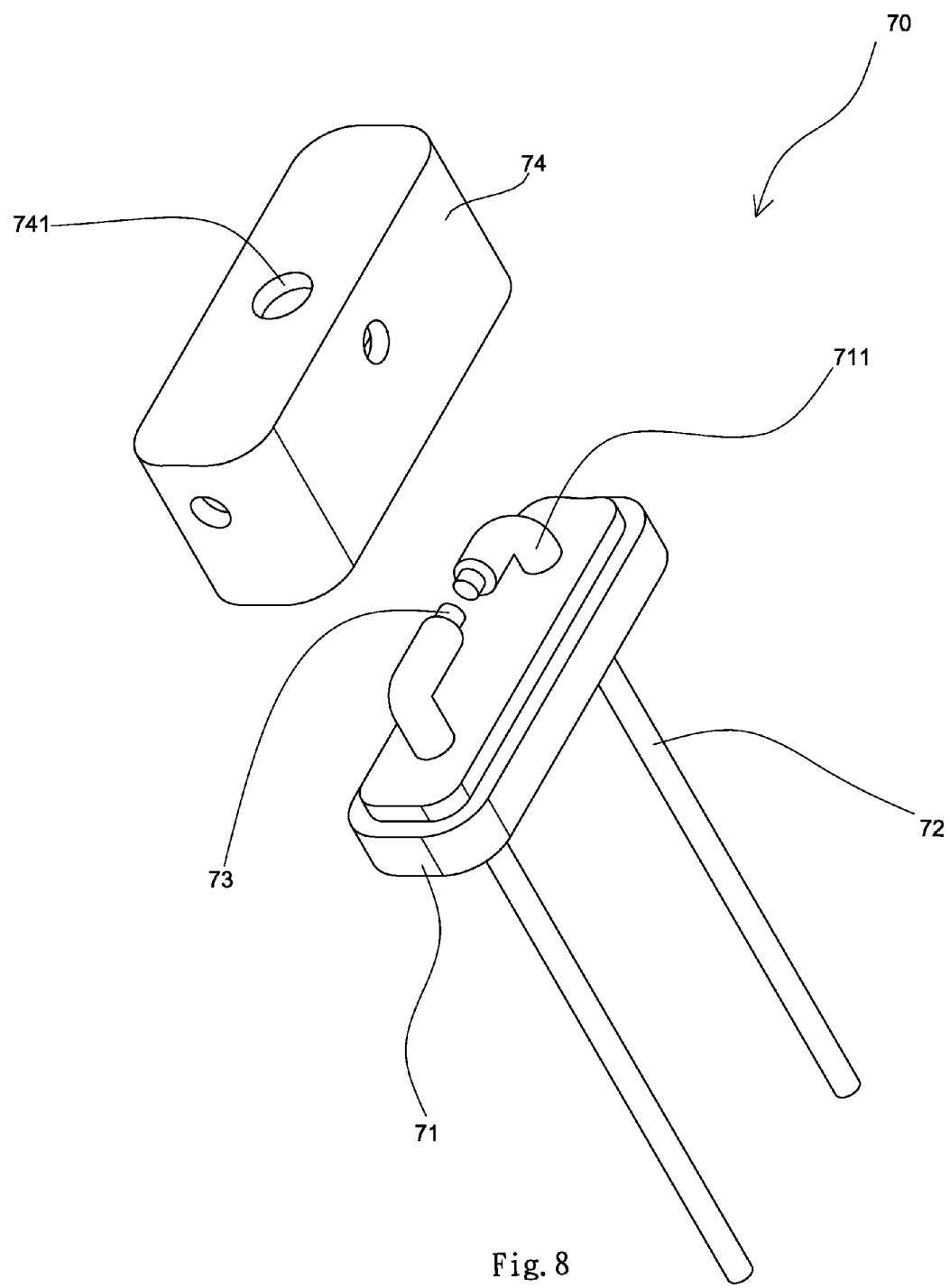
FIG. 8 is an exploded view of the second surge suppression assembly.
Figure 9:
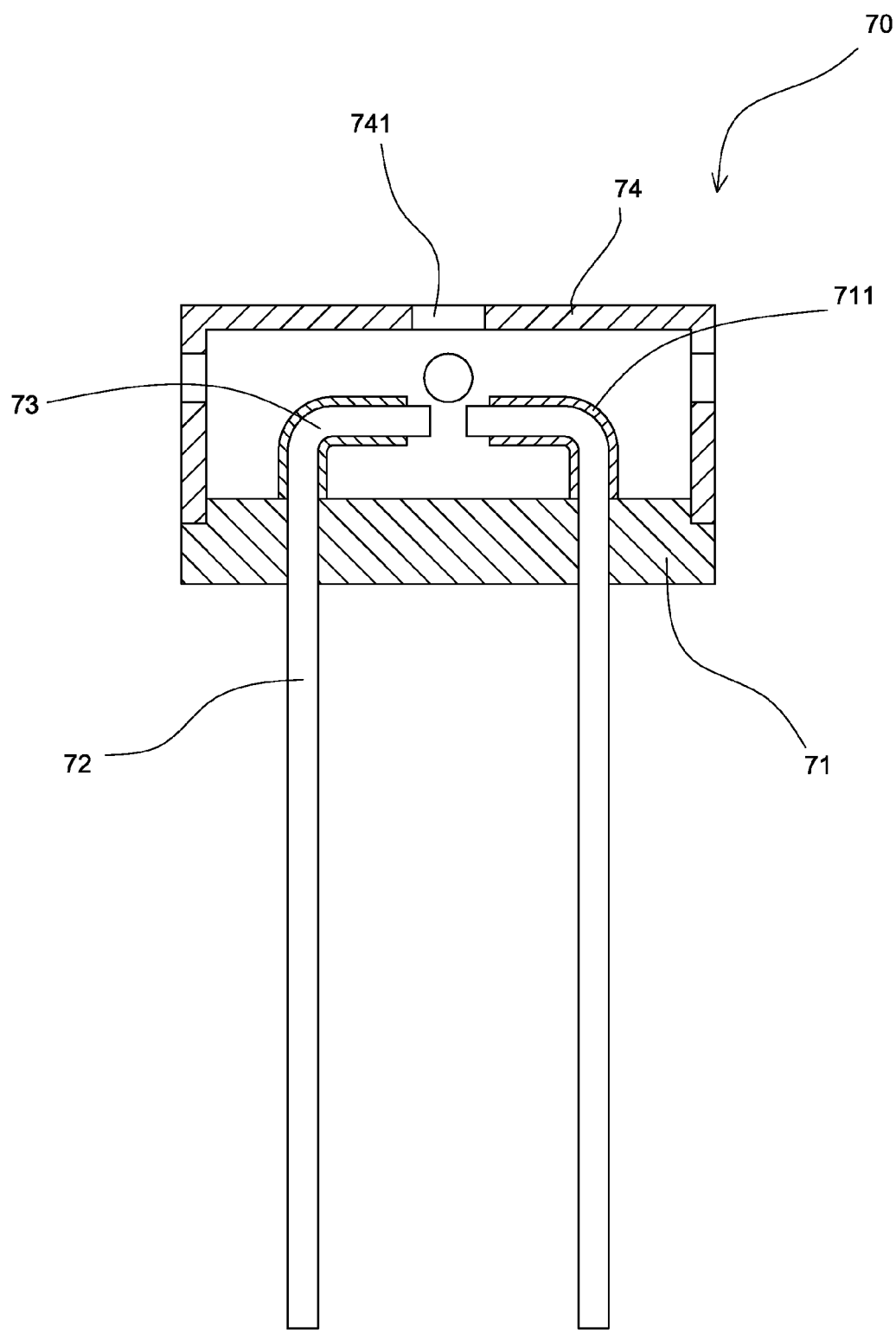
FIG. 9 is a sectional view of the assembled second surge suppression assembly.
Figure 15:
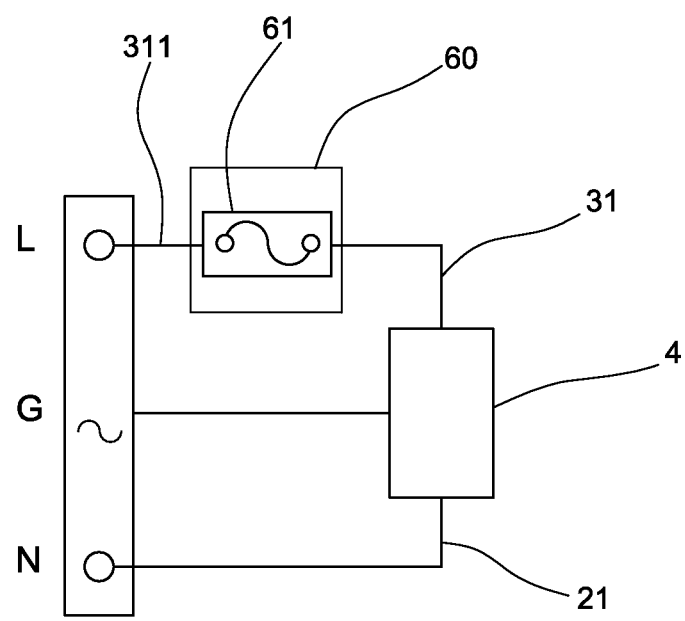
FIG. 15 schematically depicts electrical connection of a third surge suppression assembly and a first configuration of the overvoltage protection assembly according to the invention.

As shown in FIG. 15, it schematically depicts electrical connection of a third surge suppression assembly and the first configuration of the overvoltage protection assembly of the invention. The difference between the circuitry of FIG. 15 and that of FIG. 2 is that the former is implemented in a three-phase power source so that the third surge suppression assembly can discharge voltage spikes out of the three-phase power source.

The surge protector is an open circuit when activated. In the event of electrical surges occurring on AC power mains from lightning surges and an external circuit breaker (not shown) being open (i.e., have not detected a fault condition to immediately discontinue electrical flow), voltage spikes may pass to the toothed edges of the first and second conductive layers 20, 30 to electrically discharge which in turn may send a signal to the circuit breaker so that it may detect a fault condition and, by interrupting continuity, to immediately discontinue electrical flow. As a result, an electrical appliance (i.e., the load) electrically connected to the surge protector can be protected.

The surge protector is housed in an insulating case for preventing dust and other foreign objects from entering. The surge protector comprises a printed circuit board (PCB) having one layer or a plurality of layer units. Each layer unit comprises a first conductive layer 20 coated with tin for resisting oxidation and a second conductive layer 30 coated with tin for resisting oxidation. A plurality of openings 12 for short circuit are provided between the first conductive layer 20 and the second conductive layer 30. Alternatively, a plurality of openings 12 for short circuit are further provided between any two adjacent layer units if the PCB is a multi-layered structure.

Alternatively, the surge protector of the invention can be implemented as a PCB directly formed with circuitry of an electrical appliance for saving space.

The surge protector of the invention implemented as a PCB facilitates mass production as compared with metal sheet shaped surge protector of the prior art.

While the invention has been described in terms of preferred embodiments, those skilled in the art will recognize that the invention can be practiced with modifications within the spirit and scope of the appended claims.

What is claimed is:

1. A surge protector comprising:
a first surge suppression assembly (1) comprising a base board (10), a first conductive layer (20) disposed on the base board (10), a second conductive layer (30) disposed on the base board (10) and spaced from the first conductive layer (20) wherein the first conductive layer (20) comprises an arm (21), an extension (22) distal to the arm (21) and having toothed edges, a substantially C-shaped member (23) projecting out of the extension (22) and having toothed edges, and a substantially circular member (24) with toothed edges formed at an open end of the extension (22) to be disposed at about center of the substantially C-shaped member (23); the second conductive layer (30) comprises an arm (31) including a terminal (311), an extension (32) being distal to the arm (31), a projecting first substantially C-shaped member (33) having toothed edges, and a second substantially C-shaped member (34) at an open end of the extension (32); and the first substantially C-shaped member (33), the substantially C-shaped member (23), the second substantially C-shaped member (34), and the substantially circular member (24) are arranged in a concentric, spaced fashion with two sets of two half-circular gaps (11) formed at positions spaced from both sides of the extension (22) respectively; and
an overvoltage protection assembly (60) comprising an overvoltage protection member (61) interconnecting the arm (31) and the terminal (311);

wherein the overvoltage protection assembly (60) is electrically connected to the first surge suppression assembly (1) via the arm (31); and wherein the overvoltage protection member (61) is implemented as a unitary member, a plurality of members connected in series, or a plurality of members connected in parallel.

2. The surge protector of claim 1, further comprising a second surge suppression assembly (70) connected in parallel to the first surge suppression assembly (1).

3. The surge protector of claim 2, wherein the second surge suppression assembly (70) comprises a support (71), two spaced wires (72) each having a discharge end (73) passing through the support (71), the discharge ends (73) being close to each other, and a cover (74) having a plurality of openings (741), the cover (74) adapted to complimentarily engage with the support (71) to conceal the discharge ends (73).

4. A surge protector comprising:
a first surge suppression assembly (2) comprising a base board (10), a first conductive layer (20) disposed on the base board (10), a second conductive layer (30) disposed on the base board (10) and spaced from the first conductive layer (20) wherein the first conductive layer (20) comprises an arm (21), an extension (22) distal to the arm (21) and having toothed edges, a square bracket shaped member (23) projecting out of the extension (22) and having toothed edges, and a substantially circular member (24) with toothed edge formed at an open end of the extension 22 to be disposed at about center of the square bracket shaped member (23); the second conductive layer (30) comprises an arm (31) including a terminal (311), an extension (32) being distal the arm (31) and having toothed edges, a projecting first square bracket shaped (33) having toothed edges, and a second square bracket shaped member (34) disposed at an open end of the extension (32); and the first square bracket shaped (33), the square bracket shaped member (23), the second square bracket shaped member (34), and the substantially circular member (24) are arranged in a spaced fashion with two sets of first and second square bracket shaped gaps (11) formed at positions spaced from both sides of the extension (22) respectively; and
an overvoltage protection assembly (60) comprising an overvoltage protection member (61) interconnecting the arm (31) and the terminal (311);
wherein the overvoltage protection assembly (60) is electrically connected to the first surge suppression assembly (1) via the arm (31); and
wherein the overvoltage protection member (61) is implemented as a unitary member, a plurality of members connected in series, or a plurality of members connected in parallel.

5. The surge protector of claim 4, further comprising a second surge suppression assembly (70) connected in parallel to the first surge suppression assembly (1).

6. The surge protector of claim 5, wherein the second surge suppression assembly (70) comprises a support (71), two spaced wires (72) each having a discharge end (73) passing through the support (71), the discharge ends (73) being close to each other, and a cover (74) having a plurality of openings (741), the cover (74) adapted to complimentarily engage with the support (71) to conceal the discharge ends (73).

7. A surge protector comprising:
a first surge suppression assembly (3) comprising a base board (10), a first conductive layer (20) disposed on the base board (10), a second conductive layer (30) disposed on the base board (10) and spaced from the first conductive layer (20) wherein the first conductive layer (20) comprises an arm (21), an extension (22) distal to the arm (21) and having toothed edges, a substantially half-circular member (23) projecting out of the extension (22) and having toothed edges, and a substantially half-circular member (24) with toothed edges formed at an open end of the extension (22) to be disposed at about center of the substantially half-circular member (23); the second conductive layer (30) comprises an arm (31) including a terminal (311), an extension (32) being distal to the arm (31), a projecting first substantially half-circular member (33) having toothed edges, and a second substantially half-circular member (34) at an open end of the extension (32); and the first substantially half-circular member (33), the substantially half-circular member (23), the second substantially half-circular member (34), and the substantially half-circular member (24) are arranged in a spaced fashion with two substantially half-circular gaps (11) formed between the first substantially half-shaped member (33) and the substantially half-shaped member (23), and between the second substantially half-shaped member (34) and the substantially half-circular member (23) respectively; and
an overvoltage protection assembly (60) comprising an overvoltage protection member (61) interconnecting the arm (31) and the terminal (311);
wherein the overvoltage protection assembly (60) is electrically connected to the first surge suppression assembly (1) via the arm (31); and
wherein the overvoltage protection member (61) is implemented as a unitary member, a plurality of members connected in series, or a plurality of members connected in parallel.

8. The surge protector of claim 7, further comprising a second surge suppression assembly (70) connected in parallel to the first surge suppression assembly (1).

9. The surge protector of claim 8, wherein the second surge suppression assembly (70) comprises a support (71), two spaced wires (72) each having a discharge end (73) passing through the support (71), the discharge ends (73) being close to each other, and a cover (74) having a plurality of openings (741), the cover (74) adapted to complimentarily engage with the support (71) to conceal the discharge ends (73).

10. The surge protector of claim 7, further comprising a fifth conductive layer (51) and a sixth conductive layer (52) wherein one ends of the fifth conductive layer (51) and the sixth conductive layer (52) are electrically connected to a third conductive layer (41) and a fourth conductive layer (42) respectively and the other ends thereof are provided with opposite teeth.

11. The surge protector of claim 10, wherein the other ends of the fifth conductive layer (51) and the sixth conductive layer (52) are formed with teeth.

12. The surge protector of claim 10, further comprising a gap (53) formed between the fifth conductive layer (51) and the sixth conductive layer (52).

* * * * *